United States Patent [19] [11] Patent Number: 4,904,429
Takahashi et al. [45] Date of Patent: Feb. 27, 1990

[54] METHOD OF PRODUCING A MOLDING OF FOAMED RESIN HAVING A SECTION FOR FITTING AN ELECTRICAL PART

[75] Inventors: Kan-ichi Takahashi; Toshihiro Inoue, both of Wako, Japan

[73] Assignee: Honda Giken Kogyo Kabushiki Kaisha, Tokyo, Japan

[21] Appl. No.: 281,319

[22] Filed: Dec. 8, 1988

[30] Foreign Application Priority Data

Dec. 9, 1987 [JP] Japan .................. 62-309393

[51] Int. Cl.⁴ ............................................. B29C 67/22
[52] U.S. Cl. .................. 264/46.7; 264/46.4; 264/272.11
[58] Field of Search .......... 264/46.4, 46.7, 272.11, 264/45.1

[56] References Cited

U.S. PATENT DOCUMENTS 3,534,129 10/1970 Bartel .................. 264/45.1
4,350,544  9/1982 Matsuno ............... 264/46.5
4,369,562  1/1983 Lyonnet ............... 264/46.7
4,420,447 12/1983 Nakashima ............ 264/46.7
4,544,126 10/1985 Melchert .............. 264/46.7

FOREIGN PATENT DOCUMENTS 63-166508  7/1988 Japan .................. 264/272.11
  952209   3/1964 United Kingdom .
 1166603  10/1965 United Kingdom .
 2201629   9/1988 United Kingdom .

Primary Examiner—Jan H. Silbaugh
Assistant Examiner—Allan R. Kuhns
Attorney, Agent, or Firm—Armstrong, Nikaido, Marmelstein, Kubovcik & Murray

[57] ABSTRACT

A method of producing an instrument panel of a motor vehicle or similar molding of forming resin which includes a section for fitting an electrical part. The electrical part fitting section is constituted by a coupler engageable with the electrical part and an opening which is contiguous with the interior of the coupler. The opening is surrounded in a liquid-tight configuration by a pressing member for sealing which is disposed on one of coactive parts of a metal mold. The coupler is removably mounted on the other metal mold part. When the metal mold parts are clamped, a peripheral edge portion of the coupler abuts against a portion of the pressing member which surrounds an opening of the pressing member. A flexible printed circuit to which the electrical part is electrically connectable is interposed between the coupler and the pressing member such that terminal portions of the circuit face the inside of the coupler. When the mold parts are clamped, the printed circuit is pressed between the peripheral edge portion of the coupler and the pressing member to be fixed in place and, therefore, the terminal portions of the printed circuit are surely maintained in their predetermined positions despite pressures ascribable to an undiluted solution of foaming resin which is poured into the cavity of the metal mold, caused to foam, and solidified. Further, such a solution is prevented from flowing out of the cavity into the coupler.

5 Claims, 3 Drawing Sheets

1

METHOD OF PRODUCING A MOLDING OF FOAMED RESIN HAVING A SECTION FOR FITTING AN ELECTRICAL PART

BACKGROUND OF THE INVENTION

The present invention relates to a method of producing an instrument panel of a motor vehicle or similar molding of foamed resin capable of fitting electrical parts thereon as desired. More particularly, the present invention is concerned with a method of producing a molding of foamed resin in which a flexible printed circuit (FPC), which is electrically connectable to electrical parts, is buried.

In a motor vehicle, for example, an instrument panel is loaded with a combination meter which is the combination of various kinds of meters such as a speedometer, warning lamps, etc. Also mounted on the instrument panel are a heater control switch, a cruise control switch and other various switches, a cigarette lighter, a radio, and so on. A prerequisite of an instrument panel is therefore that it be provided with exclusive sections for fitting such electrical parts.

Each electrical part fitting section stated above usually includes a coupler for receiving an electrical part therein. When an electrical part is inserted in the coupler, electrical connection of the electrical part to a power supply or the like is established. Wirings are laid in the individual fitting sections and each has terminals which are disposed in the interior of the associated coupler.

An instrument panel has to be provided with a number of such fitting sections for electrical parts, and a wiring has to be provided in each of the fitting sections. Efficient wiring may therefore be promoted by using an FPC which is extremely thin and easy to deform. More specifically, an FPC consists of a pair of resin films and a lead circuit which is configured by etching copper foil or similar metal foil and sandwiched between the resin films. The FPC not only allows a number of leads to be collectively formed in a single sheet but also readily adapts itself to any complicated surface configuration such as the surface of an instrument panel, promoting the ease of wiring work.

An instrument panel has customarily been implemented as a laminate having three layers, i.e., a covering made of soft resin, a base made of ABS resin or similar hard resin, and a padding made of foamed urethane or similar foaming resin and sandwiched between the covering and the base. An FPC and couplers are each mounted on the base by using adhesive or screws. Such a prior art three-layer instrument panel, however, is not satisfactory because the base and the padding have to be produced independently of each other and then bonded together, resulting in a disproportionate production cost.

In the light of this, even the base may be formed from a foamed resin and molded integrally with the padding. A question arising here is how to mount the FPC and couplers on the instrument panel. Specifically, when the base is made of foamed resin, it is impossible to fit the electrical parts on the base by an using screws. Even if such fitting is implemented by adhesive, the electrical parts easily come off because the base made of the foamed resin is elastic. Further, the adhesive scheme is not effective to sufficiently cut down the production cost because the adhesion has to be performed after the whole instrument panel has been molded.

In the case that parts in general are fitted on a molding of foamed resin which includes a base of foamed resin, they may be buried in the base to be molded integrally with the base. It may therefore be contemplated to bury an FPC and couplers in the base of an instrument panel which is made of foamed resin when the latter is molded. This not only eliminates the need for the adhesion otherwise performed after molding but also protects the FPC from damage during the transport, assembly or the like of the instrument panel because it is accommodated in the base.

Any electrical part may be buried in a base of foamed resin simply by positioning it in a metal mold and then pouring an undiluted solution of foaming resin in the metal mold and causing it to foam and solidify. However, since the FPC to be buried in the base is in the form of a thin flexible sheet, the FPC simply positioned in the metal mold is apt to deform due to pressures ascribable to the solution which is poured and caused to foam. When so deformed, the FPC and therefore its terminals are brought out of their predetermined positions and fail to make electrical contact with an electrical part.

A further prerequisite of a coupler is that it be exposed to the outside on the front side of a molding of foamed resin in order to allow an electrical part to mate with the coupler. While this prerequisite may be met by shaving off the base after the molding has been produced so as uncover the inner walls of the coupler, this kind of approach not only makes it necessary to machine the molding produced but also brings about a fear that the terminals of the FPC disposed in the coupler are cut off when the base is shaved off. Preferably, therefore, an opening contiguous with the interior of the coupler should be formed through the base for receiving an electrical part in the event of molding the base. However, should the foaming resin be admitted into the coupler to stick to the terminals of the FPC, the resin would disturb the contact of the coupler with an electrical part because it is electrically insulative. For this reason, the interior of the coupler should be completely sealed from the exterior.

SUMMARY OF THE INVENTION

It is therefore an object of the present invention to provide a method which allows electrical part fitting sections with wirings to be formed while the production of a molding foaming resin is under way.

It is another object of the present invention to provide a method which allows an FPC to be buried in a molding of foaming resin with its terminals being accurately positioned in a coupler.

It is another object of the present invention to provide a method which allows a coupler to be molded integrally with a molding of foamed resin while sealing the interior of the coupler from the exterior and thereby forming an opening contiguous with the interior of the coupler.

In order to achieve the above objects, in accordance with the present invention, a pressing member for sealing is provided on one of coactive parts of a metal mold adapted to produce a molding of foamed resin in such a manner that the pressing member surrounds in a liquid-tight manner an opening through which an electrical part may be inserted. A coupler is removably mounted on the other mold part while being positioned such that a peripheral edge portion of the coupler abuts against a portion of the pressing member which surrounds the opening when the coactive mold parts are clamped. After an FPC has been positioned between the pressing member and the coupler with its terminal portions facing the inside of the coupler, the mold parts are clamped and then an undiluted solution of foaming resin is filled in a cavity which is defined between the metal mold parts. This is followed by causing the solution to foam and solidify.

By the above procedure, the peripheral edge portion of the coupler is pressed against the portion of the pressing member which surrounds the opening when the mold parts are clamped together, the FPC being sandwiched between and therefore fixed in position by the coupler and the pressing member. This maintains at least the terminal portions of the FPC in their predetermined positions despite pressures ascribable to the solution poured, foamed and solidified in the cavity. The abutting portions of the coupler and pressing member make close contact with each other with the intermediary of the FPC, insuring liquid-tight sealing. Hence, the foamed resin is prevented from entering the interior of the coupler and therefore from sticking to the terminals of the FPC. The interior of the coupler is exposed to the exterior at the front side of the molding through the opening of the pressing member. In this condition, an electrical part may be inserted into the opening to mate with the coupler. In this manner, an electrical part fitting section with wirings is formed at the same time as the molding is produced.

In a preferred embodiment of the present invention, the molding of foamed resin comprises a laminate of first and second layers of foaming resin which are produced in sequence. The first layer which underlies the second layer plays the role of the pressing member for sealing and therefore eliminates the need for an independent pressing member, reducing the total number of structural parts and elements. The pressing member further enhances the positive sealing between the coupler and itself because it has a substantial degree of elasticity.

The double-layer structure mentioned above is especially advantageous when the molding is provided with a covering. Specifically, the first layer may be provided with a substantially uniform thickness and molded integrally with the covering, thereby preventing the covering from creasing or otherwise deforming.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
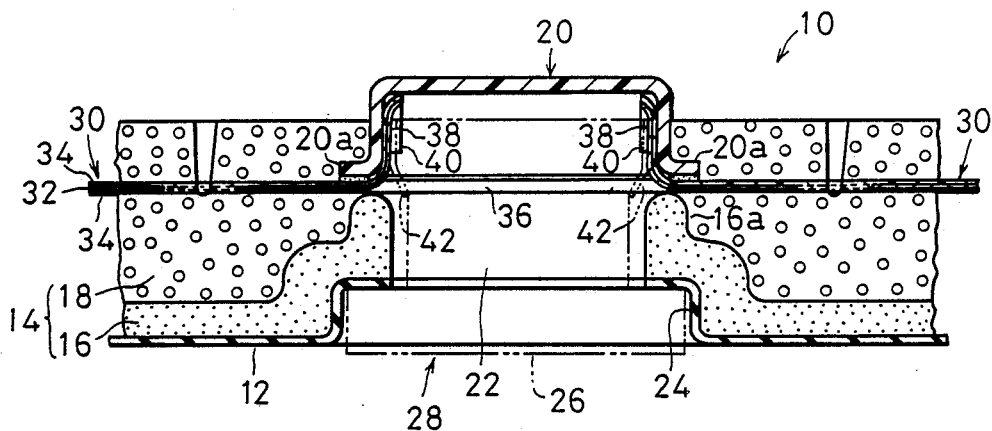
FIG. 1 is a fragmentary section of an instrument panel representative of a family of moldings of foaming resin which may be produced by a method embodying the present invention.

Referring to FIG. 1 of the drawings, an instrument panel produced by a method of the present invention is shown and generally designated by the reference numeral 10. The instrument panel 10 generally comprises a covering 12 and a base 14 made of foamed resin. The base 14 is made up of a first layer 16 produced by a primary foaming step to extend along the covering 12 and a second layer 18 laminated on the first layer 16 by a secondary foaming step. The first layer 16 of foamed resin is provided with a substantially uniform thickness.

A generally box-like coupler 20 is located in a predetermined position of the instrument panel 10. The coupler 20 has a substantially rectangular section one end of which is open and is provided with a flange 20a around the open end. The coupler 20 is embedded in the second layer 18 of the foamed resin such that its open end is oriented toward the front end of the instrument panel 10. An opening 22 is formed through the instrument panel 10 to communicate with the interior of the coupler 20. Provided in the front end of the instrument panel 10 is a recess 24 which surrounds the opening 22. In this configuration, the interior of the coupler 20 is accessible from the front of the instrument panel 10 through the recess 24 and opening 22. An electrical part 26 may be inserted in the aligned recess 24 and opening 22 until its tip mates with the coupler 20. More specifically, the recess 24, opening 22 and coupler 20 cooperate to constitute a section for fitting the electrical part 26, i.e. electrical part fitting section 28.

Figure 2:
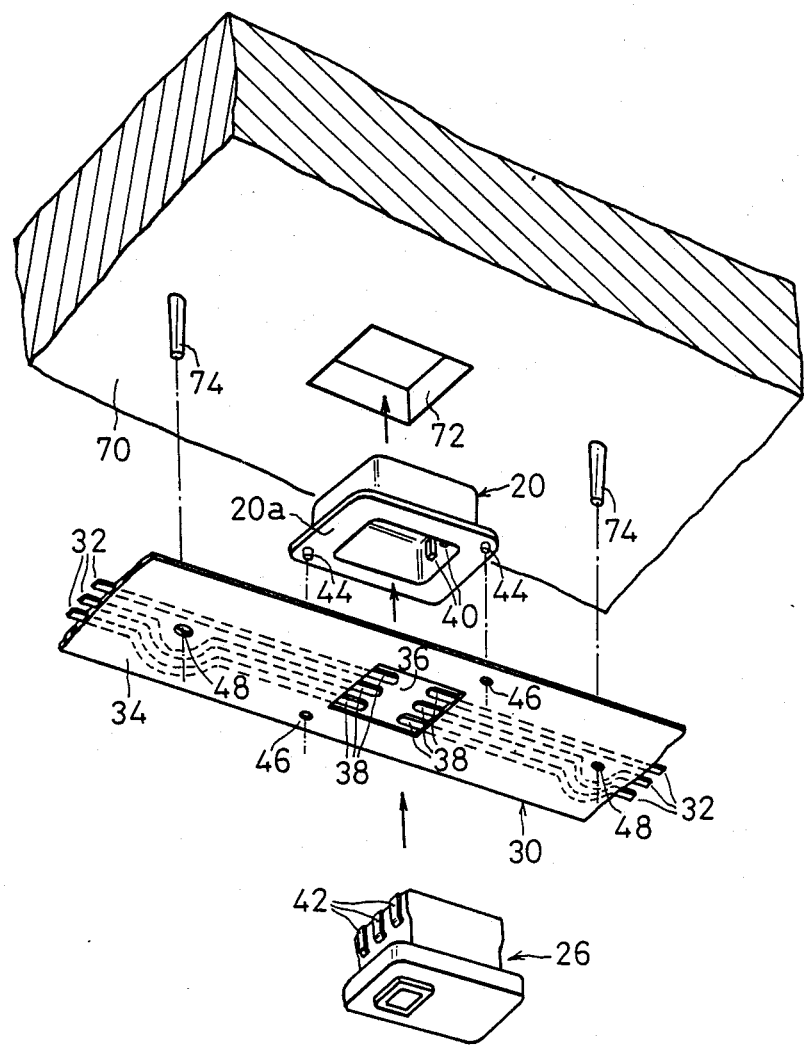
FIG. 2 is a perspective view showing an upper part of a metal mold used to fabricate the instrument panel of FIG. 1, a coupler, an FPC, and an electrical part to be fitted on the instrument panel.

As shown in FIG. 2, the electrical part 26 has a generally rectangular cross-section. The opening 22 and recess 24 formed in the instrument panel 10 are each provided with a generally rectangular section in matching relation to the electrical part 26. The opening 22 is surrounded by a hollow rectangular portion 16a of the foaming resin layer 16.

An FPC 30 is buried in the foamed resin layer 18 which overlies the layer 16 and is made up of a pair of resin films 34 and several flat leads 32 sandwiched between the resin films 34. The leads 32 are implemented by copper foil. As shown in FIG. 2, the FPC 30 is formed with an opening 36 in alignment with the open end of the coupler 20, the ends of the leads 32 protruding into the opening 36. One surface of the protruding end of each lead 32 is exposed from the resin film 34 to provide a terminal 38.

As shown in FIG. 1, the FPC 30 is held between the flange 20a of the coupler 20 and the end of the hollow rectangular portion 16a of the resin layer 16 around its opening 36. The terminals 38 of the FPC 30 are so bent as to extend on and along the inner side walls of the coupler 20. A plurality of ridges 40 extend on the inner side walls of the coupler 20 to physically isolate the nearby terminals 38. When the electrical part 26 is received in the coupler 20, terminals 42 provided on the outer side walls of the electrical part 26 individually make contact with the terminals 38 of the FPC 30 and are therefore electrically connected to the latter.

As shown in FIG. 2, a pair of positioning pins 44 are studded on the flange 20a of the coupler 20 while a pair of apertures 46 for receiving the pins 44 are formed through the FPC 30 in the vicinity of the opening 36. Also formed through the FPC 30 in positions remote from the opening 36 are a plurality of apertures 48 the function of which will be described in detail later. The leads 32 of the FPC are so configured as not to interfere with the apertures 46 and 48.

Figure 3A:
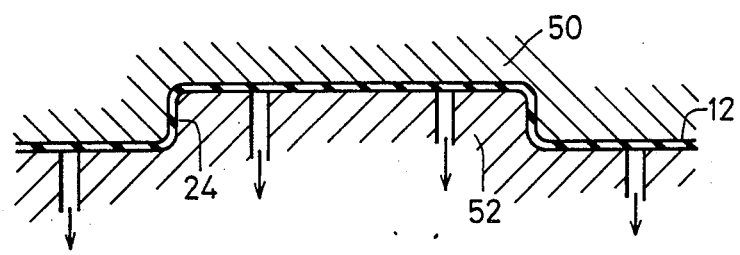
FIGS. 3A to 3D are sections showing a sequence of steps for producing the instrument panel of FIG. 1.

A sequence of steps for fabricating the instrument panel 10 are described below with reference to FIGS. 3A to 3D. First, the covering 12 is shaped to have a predetermined configuration, as shown in FIG. 3A. More specifically, a sheet of soft resin which is produced by adding polyvinyl chloride to ABS resin, for example, is shaped by using one or both of an upper part 50 and a lower part 52 of a metal mold and sucking it by vacuum. By this step, the covering 12 is provided with the recess 24 in a predetermined position thereof.

Figure 3B:
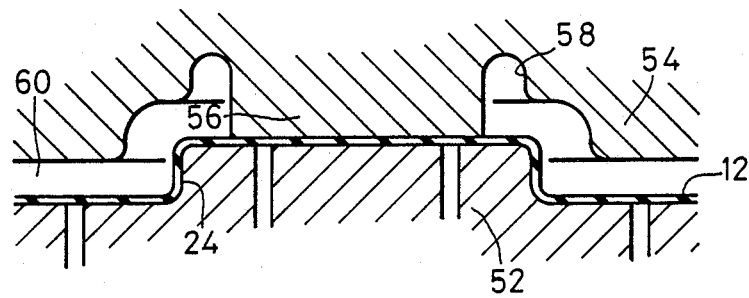

As shown in FIG. 3B, the covering 12 with the recess 24 is loaded on a metal mold adapted for primary molding. In this particular embodiment, the lower part 52 used to shape the covering 12 as stated above is also used for a lower part of the metal mold for primary molding. An upper part 54 of the metal mold for primary molding has a projection 54 which will abut against a portion of the back of the covering 12 where the recess 24 is defined. The cross-section of the projection 56 is identical with the cross-section of the opening 22 which is to be formed through the instrument panel 10. A concavity 58 is formed in the upper mold part 54 around the projection 56. The other portions of the working surface of the upper mold part 54 are so configured as to define a cavity 60 having a substantially uniform thickness when the upper mold part 54 and lower mold part 52 are clamped together.

After the upper mold part 54 has been pressed against the counterpart 52 with the intermediary of the covering 12, an undiluted solution of resin is poured into the cavity 60, and is caused to foam, and then solidified. As a result, the first layer 16 of foamed resin, whose shape is complementary to the shape of the cavity 60, is formed on and firmly adhered to the covering 12. Since the layer 16 has a substantially uniform thickness, it does not cause the covering 12 to crease or otherwise deform due to an irregular contraction distribution.

Figure 3C:
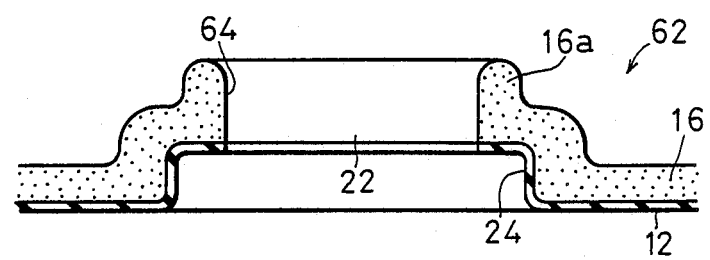

FIG. 3C shows the resulting primary molding 62 which has the first layer 16 of foamed resin on the back of the covering 12. The primary molding 62 includes the hollow rectangular portion 16a which is defined by the concavity 58 of the upper mold part 54 and a bore 64 which is surrounded by the rectangular portion 16a and extends as far as the covering 12. Then, a part of the covering 12 which corresponds to the bore 64 is removed by trimming. As a result, the opening 22 is produced in the primary molding 62 throughout the covering 12 and resin layer 16.

Figure 3D:
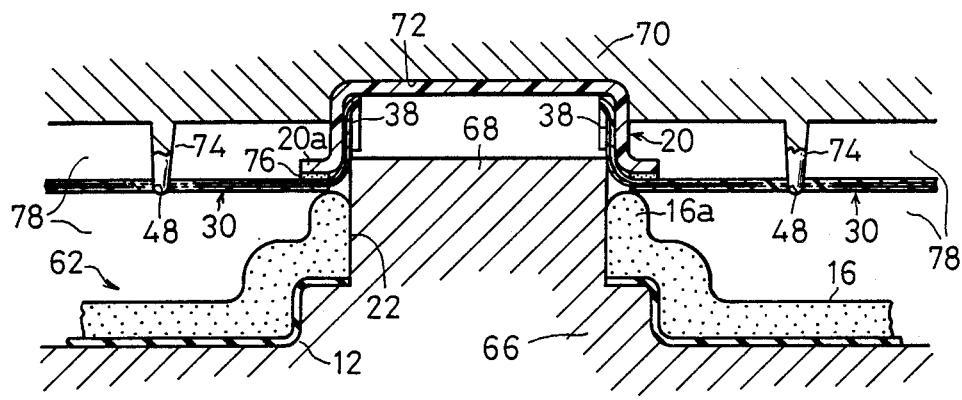

As shown in FIG. 3D, the primary molding 62 produced by the above steps is loaded on a lower part 66 of a metal mold which is adapted to produce an instrument panel in cooperation with an upper part as will be described. The lower mold part 66 includes a projection 68 which mates with the opening 22 of the primary molding 62. The upper end of the projection 68 is located at a higher level than the upper end of the hollow rectangular portion 16a of the first resin layer 16. The primary molding 62 is positioned relative to the lower mold part 66 by the projection 68 of the latter which mates with the opening 22.

As shown in FIGS. 2 and 3D, an upper mold part 70 which cooperates with the lower mold part 66 includes a rectangular recess 72 which is aligned with the projection 68 of the counterpart 66 and serves to accommodate a back portion of the coupler 20. The upper mold part 70 further includes a plurality of lugs 74 which are located at opposite sides of and remote from the recess 72. Each of the lugs 74 is constituted by a conical trunk portion and a spherical tip portion having a small diameter and at which the trunk portion terminates. The diameter of the tip portion is selected to be capable of entering the aperture 48 of the FPC 30 and thereby retaining the FPC 30. The distance between the lugs 74 is equal to the distance between the apertures 48.

The coupler 20 and FPC 30 are loaded on the upper mold part 70 beforehand. In this instance, the apertures 46 of the FPC 30 are individually engaged with the positioning pins 44 of the coupler 20 to thereby position the FPC 30 such that the portion of the FPC 30 surrounding the opening 36 is laid on the flange 20a of the coupler 20 and the terminals 38 of the FPC 30 face the inside of the coupler 20. If such an implementation is not sufficient to prevent the FPC 30 from slipping off the coupler 20, adhesive 76 may be used as shown in FIG. 3D to adhere the FPC 30 to the flange 20a of the coupler 20. The coupler 20 carrying the FPC 30 therewith as stated is mated with the recess 72 of the upper mold part 70 and thereby removably fitted on the upper mold part 70. Further, the apertures 48 of the FPC 30 are individually coupled with the spherical tip portions of the lugs 74 so that the other portions of the FPC 30 are supported by the upper mold part 70.

After the coupler 20 and FPC 30 have been positioned on the upper mold part 70 as mentioned above, it is pressed against the mold part 66 which is loaded with the primary molding 62, as shown in FIG. 3D. Then, the projection 68 of the lower mold part 66 protrudes into the coupler 20 to bend the terminals 38 of the FPC 30 along the inner side walls of the coupler 20. At the same time, the flange 20a of the coupler 20 is pressed against the hollow rectangular portion 16a of the first resin layer 16 through the FPC 30, whereby the FPC 30 is sandwiched between the coupler 20 and the rectangular portion 16a. Further, the rectangular portion 16a is pressed toward the lower mold part 66 to in turn press the portion of the covering 12 which surrounds the opening in cooperation with the counterpart 66. As a consequence, the coupler 20 and the FPC 30, the FPC 30 and the first resin layer 16, and the portion of the covering 12 surrounding the opening and the lower mold part 66 are individually sealed liquid-tight. More specifically, in this particular embodiment, the hollow rectangular portion 16a of the layer 16 serves as a pressing member for sealing as referred to in the instant specification.

When the upper and lower mold parts 70 and 66 are clamped together as stated above, a cavity 78 is defined between the upper mold part 70 and the resin layer 16. Then, an undiluted solution of resin is poured into the cavity 79, caused to foam, and solidified, whereby the second layer 18 of foamed resin is developed as shown in FIG. 1. Since such an undiluted solution infiltrates into the surface of the underlying first layer 16, the second layer 18 is firmly united with the first layer 16.

While the solution of resin is introduced and caused to foam in the cavity 78, pressure acts on the hollow rectangular portion 16a of the first layer 16. Nevertheless, the rectangular portion 16a is prevented from deforming because the rectangular portion 16a is pressed between the coupler 20 and the lower mold part 66 and because the back of the rectangular portion 16a is supported by the projection 68 of the lower mold part 66. Hence, the opening 22 defined by the rectangular portion 16a for receiving the electrical part 26 preserves its shape. Also, the coupler 20 is prevented from being dislocated by the above-mentioned pressures acting thereon because the back of the coupler 20 is mated with the recess 72 of the upper mold part 70 and because the projection 68 of the lower mold part 66 is mated with the coupler 20. The FPC 30 is firmly retained between the rectangular portion 16a of the resin layer 16 and the coupler 20, so that at least the lead portions of the FPC 30 protruding into the coupler 20 are held in accurate positions. The other portions of the FPC 30 are also protected against noticeable deformation and breakage because they are supported by the upper mold part 70 through the lugs 74.

The coupler 20 and the FPC 30 and the FPC 30 and the first resin layer 16 are individually sealed liquid-tight, preventing the solutions of foaming resin from leaking into the interior of the coupler 20 and therefore from sticking to the terminals 38. Further, the flow of the solutions toward the opening 22 is eliminated to insure the predetermined shape of the opening 22.

After the second or overlying resin layer 18 has been formed, the upper mold part 70 is unclamped from the counterpart 66 with the result that the coupler 20 buried in the second resin layer 18 is removed from the upper mold part 70. At the same time, the FPC 30 is removed from the lugs 74 of the upper mold part 70 to remain in the second resin layer 18. When the resulting laminate or molding is removed from the lower mold part 66, it will have the configuration shown in FIG. 1 which includes the electrical part fitting section 28.

Since the coupler 20 of the instrument panel 10 is accessible from the outside through the opening 22, the electrical part 26 may be inserted the opening 22 until it mates with the coupler 20. This surely sets up electrical connection between the electrical part 26 and the coupler 20 because the terminals 38 of the FPC 30 are accurately positioned inside thhe coupler 20. In addition, incomplete electrical contact due to the deposition of solutions on the terminals 38 is eliminated.

The method of the present invention shown and described is applicable not only to a molding of foaming resin having the covering 12 but also to a molding without such a covering. For a molding without the covering 12, the first resin layer 16 may be provided only in a limited portion which faces the peripheral portion of the coupler 20, i.e., only the hollow rectangular portion 16a of the illustrative embodiment may be provided and, in such a case, the rectangular portion or pressing member for sealing 16a may be made of hard resin. Then, the projection 68 of the lower mold part 66 is omissible.

Figure 4:
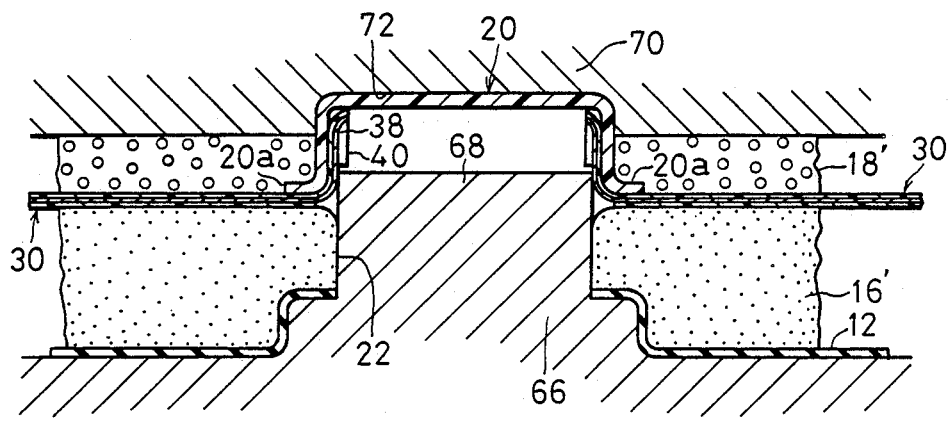
FIG. 4 is a section similar to FIG. 1, showing another embodiment of the present invention.

In the case that the first resin layer may have a substantial thickness as represented by a layer 16' in FIG. 4, the top of the layer 16' may be shaped flat to lay the FPC 30 thereon. In such a case, the FPC 30 will be stably supported by the layer 16' and, hence, it will be needless for the FPC 30 to be supported by the upper mold part 70. When the upper and lower mold parts 70 and 66 are clamped together to urge the flange 20a of the coupler 20 against the FPC 30, the FPC 30 is firmly retained between the coupler 20 and the layer 16' while, at the same time, the coupler 20 and the layer 16' are sealed liquid-tight. In this condition, an undiluted solution of foaming resin is introduced to form a second layer 18' of foaming resin in the previously discussed manner, completing a molding which is similar to the molding of FIG. 1. In the alternative embodiment of FIG. 4, it is a portion of the underlying resin layer 16' surrounding the opening 22 that constitutes the pressing member for sealing.

While the means for removably mounting the coupler 20 on the upper mold part 70 has been shown and described as comprising the recess 72 of the upper mold part 70, it may alternatively be implemented by magnets as well known in the art.

Various modifications will become possible for those skilled in the art after receiving the teachings of the present disclosure without departing from the scope thereof.

What is claimed is:

1. A method for producing a molded foamed article comprising a coupler (20) having a peripheral edge portion for receiving an electrical part, a flexible printed circuit (30) having terminals (38) which are disposed in said coupler (20) to be electrically connected to the electrical part, and an opening contiguous with the interior of said coupler to allow access of the electrical part to the interior of the coupler (20), said method comprising the steps of:

positioning a first metal mold part (66) in molding alignment with a second metal mold part (70), the first metal mold part (66) having disposed thereon a pressing member (16a) which forms a wall surrounding said opening of said molded foamed article;

removably mounting a back portion of the coupler (20) in such position on the second mold part (70) so that the peripheral edge of said coupler (20) faces the pressing member (16a);

disposing said flexible printed circuit board (30) between the pressing member (16a) and the coupler (20), the terminal (38) of the flexible printed circuit board (30) facing the interior of the coupler (20);

pressing said metal mold parts together to cause the pressing member (16a) and the coupler (20) to retain the flexible printed circuit (30) therebetween;

pouring an undiluted solution of foam resin into a cavity defined by the said metal mold parts to create a foamed molding of said molded foamed article; and releasing the metal mold parts creating a molded foamed article having a coupler for receiving an electrical part.

2. A method as claimed in claim 1, wherein said molding comprises a first layer of foamed resin and a second layer of foamed resin which is formed after said first layer, said pressing member comprising said first layer.

3. A method as claimed in claim 2, wherein said molding further comprises a covering, said first layer being provided integrally with said covering.

4. A method as claimed in claim 2, wherein said flexible printed circuit is supported on the surface of said first layer.

5. A method as claimed in claim 1, wherein said one metal mold part on which said pressing member is mounted is provided with a projection which mates with said coupler through said opening of said pressing member.

* * * * *